(12) United States Patent
Liao

(10) Patent No.: US 8,284,610 B2
(45) Date of Patent: Oct. 9, 2012

(54) DATA SENSING MODULE AND SENSING CIRCUIT FOR FLASH MEMORY

(75) Inventor: Wei-Chih Liao, Taitung County (TW)

(73) Assignee: Winbond Electronics Corp., Taichung (TW)

( * ) Notice: Subject to any disclaimer, the term of this patent is extended or adjusted under 35 U.S.C. 154(b) by 155 days.

(21) Appl. No.: 12/482,089

(22) Filed: Jun. 10, 2009

(65) Prior Publication Data

US 2010/0315877 A1    Dec. 16, 2010

(51) Int. Cl.
*G11C 11/34* (2006.01)
*G11C 16/04* (2006.01)

(52) U.S. Cl. ............... 365/185.21; 365/203; 365/204

(58) Field of Classification Search .......... 365/203 X, 365/204 X, 185.21 O
See application file for complete search history.

(56) References Cited

U.S. PATENT DOCUMENTS

| 5,015,890 | A  | * | 5/1991 | Murakami et al. | ............ 327/57 |
| 6,944,077 | B2 | * | 9/2005 | Morikawa | .................. 365/204 |
| 7,027,341 | B2 | * | 4/2006 | Morikawa | .................. 365/203 |
| 7,586,802 | B2 | * | 9/2009 | Hsu et al. | .................. 365/203 |

* cited by examiner

*Primary Examiner* — VanThu Nguyen
(74) *Attorney, Agent, or Firm* — J.C. Patents

(57) ABSTRACT

A sensing circuit for a flash memory is provided. The sensing circuit includes a first transistor, a detector, and a charge circuit. A drain of the first transistor is coupled to a bias, a gate thereof receives an inverted signal, and a source thereof receives a data. In addition, the drain of the first transistor is further coupled to the detector. Therefore, the detector detects a voltage of the drain of the first transistor. When the voltage of the drain is lower than a threshold voltage, the detector enables a control signal. The charge circuit charges the source of the first transistor when the control signal is enabled, until the voltage of the drain of the first transistor reaches the threshold voltage.

6 Claims, 3 Drawing Sheets

DATA SENSING MODULE AND SENSING CIRCUIT FOR FLASH MEMORY

BACKGROUND OF THE INVENTION

1. Field of the Invention

The present invention relates to a data sensing module. More particularly, the present invention relates to a data sensing module of a flash memory.

2. Description of Related Art

Data stored in a memory are mostly binary bits, and a device is assigned to record a state of each bit being 0 or 1, wherein such device is referred to as a memory cell. In the memory, a data write or read operation of the selected memory cell is determined by an output signal of a control circuit. During the write operation, a predetermined memory cell is selected, and then the data to be written is stored in the selected memory cell. Comparatively, during the read operation, a predetermined memory cell is also selected, and then the state of the stored bit represented by a current or a voltage is recognized by a sensing circuit.

A flash memory is a random access memory capable of maintaining the stored data under a power-off state. Due to such characteristic, the flash memory is different to a dynamic random access memory (DRAM). Moreover, compared to a hard disk, the flash memory has a better dynamic shock resistance.

Generally, data accessing time of the flash memory determines a performance of the flash memory. In the flash memory, since a large amount of memory cells are coupled to the sensing circuit, a great amount of parasitic capacitances are generally generated in the sensing circuit, which may lead to an excessive load of the sensing circuit, and accordingly the data read speed is probably delayed.

SUMMARY OF THE INVENTION

The present invention is directed to a sensing circuit, which can be used in a flash memory to increase a data reading speed.

The present invention is directed to a data sensing module of a flash memory, which can increase a performance of a read operation of the flash memory.

The present invention provides a sensing circuit of a flash memory including a first transistor, a detector, and a charge circuit. A drain of the first transistor is coupled to a bias, a gate thereof receives an inverted signal, and a source thereof receives a data. In addition, the drain of the first transistor is further coupled to the detector. Therefore, the detector detects a voltage of the drain of the first transistor. When the voltage of the drain is lower than a threshold voltage, the detector enables a control signal. The charge circuit charges the source of the first transistor when the control signal is enabled, until the voltage of the drain of the first transistor reaches the threshold voltage.

In another aspect, the present invention provides a data sensing module of a flash memory, which includes a memory core circuit, a first transistor, a detector and a charge circuit. The memory core circuit at least has a memory cell used for storing a data. The first transistor has a drain coupled to a bias, a gate receiving an inverted signal, and a source coupled to the memory core circuit for receiving the data. In addition, the drain of the first transistor is further coupled to the detector. Therefore, the detector detects a voltage of the drain of the first transistor. When the voltage of the drain is lower than a threshold voltage, the detector enables a control signal. The charge circuit charges the source of the first transistor when the control signal is enabled, until the voltage of the drain of the first transistor reaches the threshold voltage.

In an embodiment of the present invention, the data sensing module further includes an inverter having an input terminal coupled to the source of the first transistor, and an output terminal used to output the inverted signal to the gate of the first transistor.

Since the source of the first transistor is charged as the voltage of the drain of the first transistor being lower than the threshold voltage. Therefore, the performance of the data read operation can be increased.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

To fully convey the spirit of the present invention to those skilled in the art, a system structure of a flash memory is briefly described below.

Figure 1:
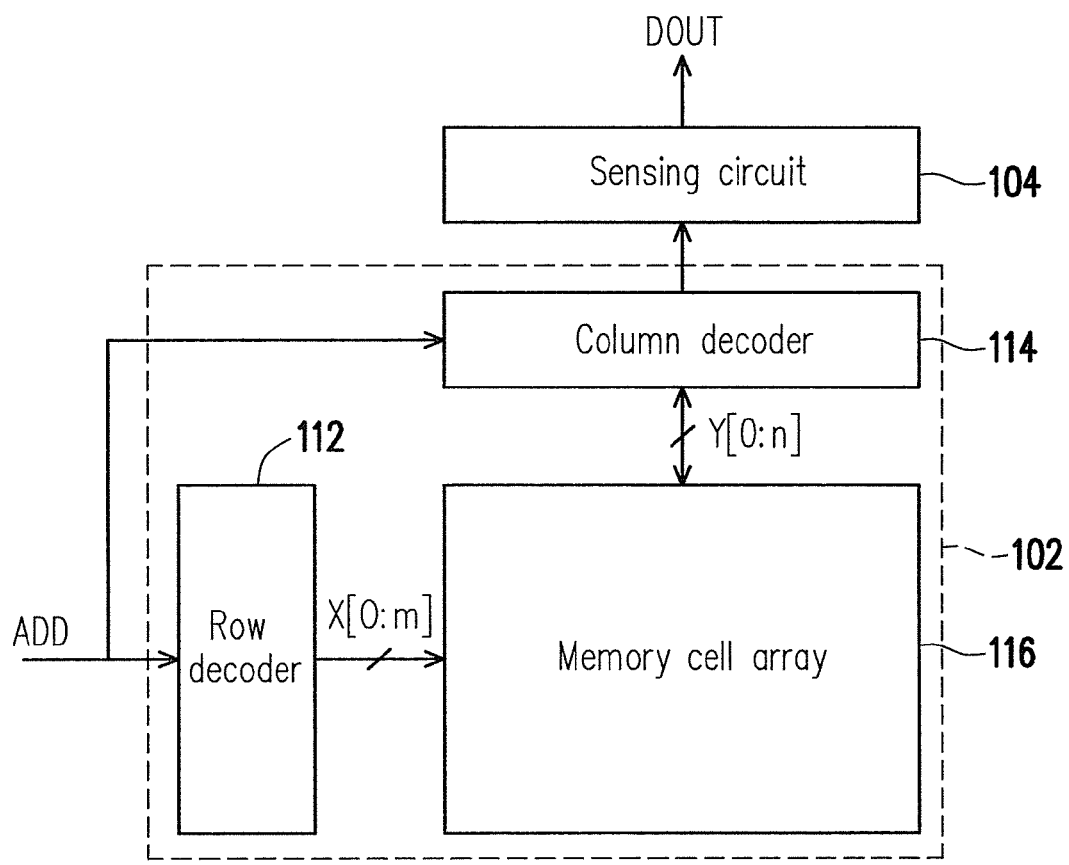
FIG. 1 is a block diagram of an internal sensing system of a flash memory.

FIG. 1 is a block diagram of an internal sensing system of a flash memory. Referring to FIG. 1, a general flash memory includes a memory core circuit 102 and a sensing circuit 104. The memory core circuit 102 coupled to the sensing circuit 104 is used for receiving an address information ADD.

The memory core circuit 102 includes a row decoder 112, a column decoder 114 and a memory cell array 116. Wherein, the memory cell array 116 has a plurality of memory cells coupled to the row decoder 112 through a plurality of word lines X[0:m], and coupled to the column decoder 114 through a plurality of bit lines Y[0:n] respectively. The row decoder 112 and the column decoder 114 can respectively receive the address information ADD, and the column decoder 114 is further coupled to the sensing circuit 104.

When a data read operation is about to be performed, the memory core circuit 102 first receives the address information ADD. After the address information ADD is transmitted to the memory core circuit 102, the row decoder 112 and the column decoder 114 respectively decode the address information ADD, so as to select one memory cell from the memory cell array 116 according to the address information ADD. Thereafter, the column decoder 114 transmits a data stored in the selected memory cell to the sensing circuit 104. Now, the sensing circuit 104 determines whether a state of the data output by the column decoder 114 is "1" or "0", and outputs a determination result thereof as an output data DOUT, so as to complete the data read operation.

Though an internal system structure of a flash memory is disclosed in FIG. 1, such structure is only used for conveying the spirit of the present invention to those skilled in the art. Therefore, the spirit of the present invention is not influenced by the flash memory of a different structure.

Figure 2:
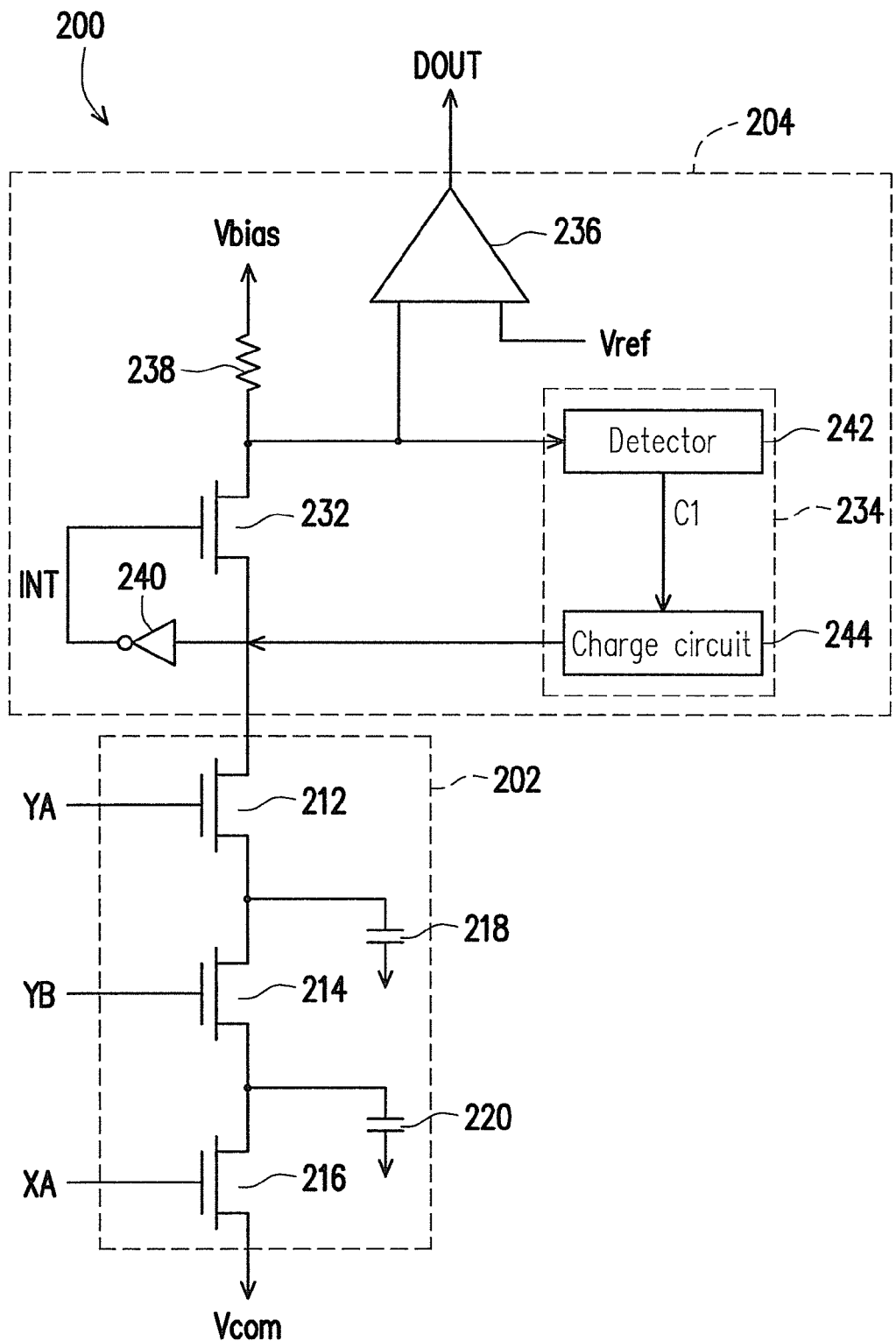
FIG. 2 is a circuit block diagram of a data sensing module according to a preferred embodiment of the present invention.

FIG. 2 is a circuit block diagram of a data sensing module according to a preferred embodiment of the present invention. Referring to FIG. 2, the data sensing module 200 includes a memory core circuit 202 and a sensing circuit 204, wherein the memory core circuit 202 is coupled to the sensing circuit 204.

The memory core circuit 202 includes transistors 212, 214 and 216. A drain of the transistor 212 is coupled to the sensing circuit 204, a gate thereof receives a bit line signal YA, and a source thereof is coupled to a memory cell 218. Similarly, a gate of the transistor 214 receives a bit line signal YB, a source of the transistor 214 is coupled to a memory cell 220, and a drain of the transistor 214 is coupled to the source of the transistor 212. Moreover, a gate of the transistor 216 receives a word line signal XA, a source thereof is coupled to a common voltage Vcom (for example, the ground voltage), and a drain thereof is coupled to the source of the transistor 214. In the present embodiment, the transistors 212, 214 and 216 can all be implemented by NMOS transistors. In some embodiments, since the transistors 214 and 212 are serially coupled to the transistor 216, the transistor 216 can be implemented by a high voltage NMOS transistor.

Referring to FIG. 2 again, the sensing circuit 204 includes a transistor 232, a boost circuit 234 and a comparator 236. A drain of the transistor 232 is coupled to a bias Vbias through a resistor 238, and a source of the transistor 232 is coupled to the drain of the transistor 212 and an input terminal of an inverter 240. In addition, an output terminal of the inverter 240 is coupled to a gate of the transistor 232.

In the present embodiment, the transistor 232 is an NMOS transistor, and the drain of the transistor 232 is further coupled to an input terminal of the comparator 236 and the boost circuit 234. Similarly, the source of the transistor 232 is coupled to the boost circuit 234. One of the input terminals of the comparator 236 is coupled to the drain of the transistor 232, and another input terminal of the comparator 236 is coupled to a reference voltage Vref.

On the other side, the boost circuit 234 includes a detector 242 and a charge circuit 244. The detector 242 is coupled to the drain of the transistor 232, and the charge circuit 244 is coupled to the source of the transistor 232.

When the bit line signals YA and YB, and the word line signal XA are all enabled, the transistors 212, 214 and 216 are turned on. Meanwhile, a voltage level of the input terminal of the inverter 240 is first pull down to a voltage level of the common voltage Vcom before the transistor 232 is turned on. For simplicity's sake, the voltage level of the common voltage Vcom is assumed to be the ground. However, those skilled in the art should understand that the present invention is not limited to such condition.

When the voltage level of the source of the transistor 232 is pull down to the ground, the inverter 240 outputs an inverted signal INT with a high voltage level to the gate of the transistor 232, so as to turn on the transistor 232. On the other hand, the detector 242 detects a voltage level of the drain of the transistor 232. When the voltage level of the drain of the transistor 232 is lower than a threshold voltage, the detector 242 enables a control signal C1. After the charge circuit 244 receives the enabled control signal C1, the charge circuit 244 charges the source of the transistor 232. The above process is referred to as a pre-charge operation.

During a period of the pre-charge operation, the voltage level of the drain of the transistor 232 is increased accompanying with that the source of the transistor 232 is charged by the charge circuit 244. When the detector 242 detects that the voltage level of the drain of the transistor 232 reaches the threshold voltage, the detector 242 disables the control signal C1. Meanwhile, the charge circuit 244 stops charging the source of the transistor 232, which represents that the pre-charge operation is ended.

After the pre-charge operation is ended, the voltage level of the drain of the transistor 232 is continually pulled up to the voltage level of the data recorded by the memory cells 218 and 220. After the voltage level of the drain of the transistor 232 is stabilized, the comparator 236 compares the voltage level of the drain of the transistor 232 and the reference voltage Vref. If the voltage level of the drain of the transistor 232 is less than the reference voltage Vref, the state of the output data DOUT output by the comparator 236 would be a first state (for example, "1"). Conversely, if the voltage level of the drain of the transistor 232 is greater than the reference voltage Vref, the state of the output data DOUT would be a second state (for example, "0"). The above operations can be regarded as a process that the data recorded in the memory cells 218 and 220 are read out. By such means, the data read operation is successfully completed.

Figure 3:
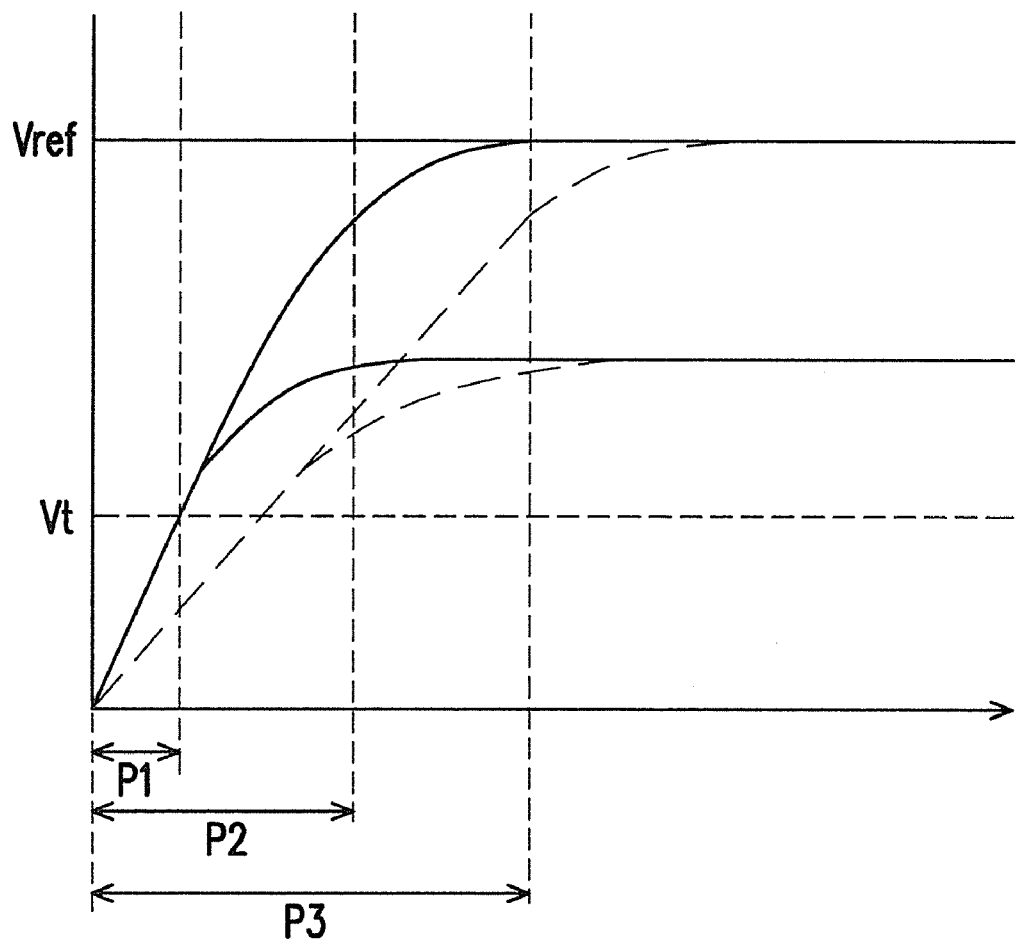
FIG. 3 is a diagram illustrating variations of a voltage of a drain of a transistor 232 of FIG. 2 relative to time.

FIG. 3 is a diagram illustrating variations of the voltage of the drain of the transistor 232 of FIG. 2 relative to time. Referring to FIG. 3, the longitudinal coordinates represent voltage values V, and the horizontal coordinates represent time t. Moreover, the curves of solid line in FIG. 3 represent a voltage variation of the drain in case that the pre-charge operation is performed, and the curves of dot line represent a voltage variation of the drain in case of a conventional technique that the pre-charge operation is not performed. According to FIG. 3, it is obvious that since the pre-charge operation is performed during a period P1 (time required for the voltage of the drain reaching the threshold voltage Vt) according to the present invention, the time P2 required for stabilizing the voltage of the drain of the present invention is shorter than the time P3 required for stabilizing the same of the conventional technique that the pre-charge operation is not performed, in which the stable voltage depicted in FIG. 3 after the time P3 may be referred to as a settling voltage. Therefore, according to the present invention, the efficiency of the data read operation of the flash memory can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data sensing module of a flash memory, comprising:
a memory core circuit, wherein the memory core circuit comprises:
a first memory cell;
a second memory cell;
a second transistor, having a gate receiving a first bit line signal, a source coupled to the first memory cell, and a drain coupled to a source of a first transistor;
a third transistor, having a gate receiving a second bit line signal, a source coupled to the second memory cell, and a drain coupled to the source of the second transistor; and
a fourth transistor, having a gate receiving a word line signal, a source coupled to a common voltage, and a drain coupled to the source of the third transistor;
a first transistor, having a drain coupled to a bias, a gate receiving an inverted signal, and the source coupled to the memory core circuit for receiving data stored in the memory core circuit;

a detector, coupled to the drain of the first transistor for detecting a voltage of the drain, wherein a control signal is directly enabled by the detector when the voltage of the drain is lower than a threshold voltage and the control signal is directly disabled by the detector when the voltage of the drain reaches the threshold voltage; and a charge circuit, coupled to the detector and the source of the first transistor, wherein the charge circuit charges the source of the first transistor when the control signal is enabled, and stops charging the source of the first transistor when the control signal is disabled and the voltage of the drain reaches the threshold voltage, the source of the first transistor being charged to a settling voltage that is higher than the threshold voltage.

2. The data sensing module as claimed in claim 1, further comprising an inverter, having an input terminal coupled to the source of the first transistor, and an output terminal used to output the inverted signal to the gate of the first transistor.

3. The data sensing module as claimed in claim 1, wherein the drain of the first transistor is further coupled to the bias through a resistor.

4. The data sensing module as claimed in claim 1, wherein the second transistor, the third transistor, and the fourth transistor are all NMOS transistors.

5. The data sensing module as claimed in claim 1, further comprising a comparator, having a first input terminal coupled to a reference voltage, and a second input terminal coupled to the drain of the first transistor for determining a state of an output terminal of the comparator according to the voltage of the drain of the first transistor.

6. The data sensing module as claimed in claim 1, wherein the first transistor is an NMOS transistor.

* * * * *